(12) United States Patent
Larsen et al.

(10) Patent No.: US 9,363,922 B2
(45) Date of Patent: Jun. 7, 2016

(54) HORIZONTAL MANAGER FOR EQUIPMENT RACKS AND ENCLOSURES

(71) Applicant: Ortronics, Inc., New London, CT (US)

(72) Inventors: Lars R. Larsen, Old Lyme, CT (US);
Chris M. Vacca, Westerly, RI (US);
Robert R. Adams, Johnston, RI (US);
Frank Ruotolo, Clinton, CT (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 14/621,774

(22) Filed: Feb. 13, 2015

(65) Prior Publication Data

US 2015/0163955 A1 Jun. 11, 2015

Related U.S. Application Data

(63) Continuation-in-part of application No. 12/905,298, filed on Oct. 15, 2010, now Pat. No. 8,955,693.

(51) Int. Cl.
| | |
|---|---|
| *H05K 7/18* | (2006.01) |
| *F16L 3/06* | (2006.01) |
| *F16L 3/26* | (2006.01) |
| *H02G 3/04* | (2006.01) |

(52) U.S. Cl.
CPC ... *H05K 7/18* (2013.01); *F16L 3/06* (2013.01); *F16L 3/26* (2013.01); *H02G 3/0418* (2013.01); *Y10T 29/49826* (2015.01); *Y10T 29/49895* (2015.01)

(58) Field of Classification Search
CPC ... H05K 7/1425; H05K 7/1461; H05K 7/183; H05K 7/186; H05K 7/1424; H05K 7/18; H05K 9/0062; H05K 5/023; G06F 1/183; F16L 3/06; F16L 3/026

USPC ......... 211/26, 183; 312/236, 265.6; 361/724, 361/727; 174/66, 67; 454/186

See application file for complete search history.

(56) References Cited

U.S. PATENT DOCUMENTS

| | | | | |
|---|---|---|---|---|
| 5,897,180 | A * | 4/1999 | Singer | 312/265.3 |
| 5,921,402 | A | 7/1999 | Magenheimer | |
| 6,546,181 | B1 * | 4/2003 | Adapathya | G02B 6/4452 385/135 |
| 6,616,005 | B1 * | 9/2003 | Pereira et al. | 220/241 |
| 6,695,149 | B1 * | 2/2004 | Cote et al. | 211/26 |
| 6,967,279 | B2 * | 11/2005 | Cerniglia et al. | 174/377 |
| 7,207,835 | B2 * | 4/2007 | Levesque | H04Q 1/066 439/540.1 |
| 7,211,744 | B2 * | 5/2007 | Jorgensen | 174/668 |
| 7,500,863 | B2 * | 3/2009 | Ringler et al. | 439/327 |
| 7,506,768 | B2 * | 3/2009 | Rassmussen et al. | 211/26 |
| 7,875,799 | B2 * | 1/2011 | Fransen et al. | 174/66 |
| 7,881,074 | B2 * | 2/2011 | Lakoduk et al. | 361/810 |
| 7,959,015 | B2 * | 6/2011 | Sempliner et al. | 211/26 |

(Continued)

*Primary Examiner* — Patrick Hawn
(74) *Attorney, Agent, or Firm* — McCarter & English, LLP

(57) ABSTRACT

A filler panel/horizontal manager for a rack includes two latching regions that mirror each other. The latching regions include a pair of guide posts configured to enter both round-shaped and square-shaped holes and guide the filler panel into a rack. The latching region further includes a pair of locator walls configured to enter square shaped holes along with the guide posts to guide the filler panel into a rack. Each latching region includes one or more latching members having surfaces for engaging a railing of a rack. At least one pair of latching members includes an angled stepped surface configured to engage railings of different thicknesses. One or more outwardly extending cable management elements may be associated with a front face of the filler panel/horizontal manager to facilitate wire/cable management functionalities.

20 Claims, 9 Drawing Sheets

(56) References Cited

U.S. PATENT DOCUMENTS

| | | | |
|---|---|---|---|
| 8,052,231 B2* | 11/2011 | Rasmussen et al. | 312/265.6 |
| 8,262,041 B2* | 9/2012 | Bergesch | 248/220.43 |
| 8,955,693 B2 | 2/2015 | Larsen et al. | |
| 2002/0153338 A1* | 10/2002 | Orr | 211/183 |
| 2006/0005988 A1* | 1/2006 | Jorgensen | 174/65 R |
| 2008/0310126 A1* | 12/2008 | Lakoduk et al. | 361/731 |
| 2009/0167127 A1* | 7/2009 | Chen et al. | 312/334.1 |
| 2009/0178985 A1* | 7/2009 | Sempliner et al. | 211/26 |
| 2011/0180314 A1* | 7/2011 | Pedoeem | H05K 9/0018 174/377 |

\* cited by examiner

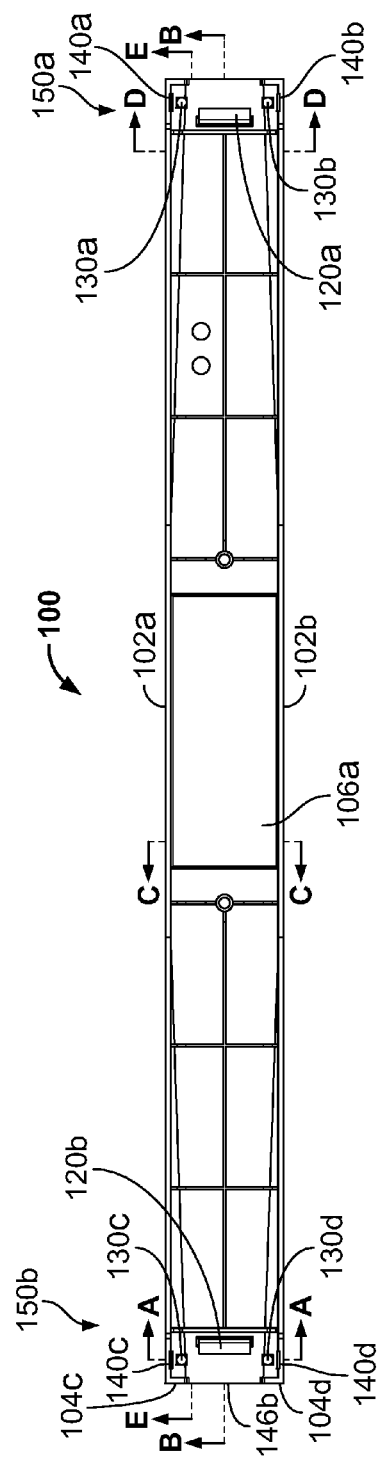
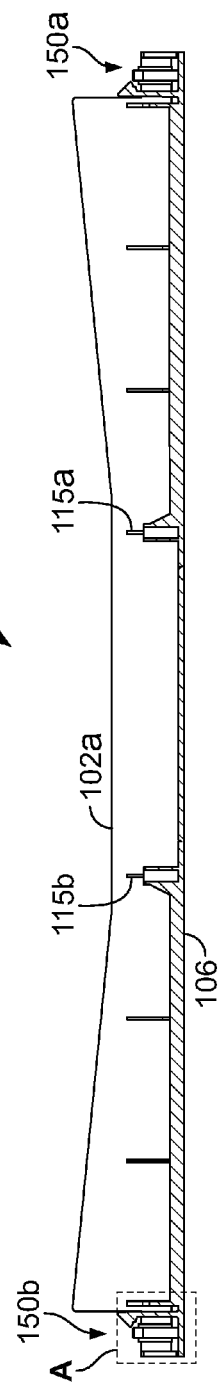
FIG. 2
FIG. 3
FIG. 4

HORIZONTAL MANAGER FOR EQUIPMENT RACKS AND ENCLOSURES

CROSS-REFERENCE TO RELATED APPLICATION

The present application is a continuation-in-part application that claims priority benefit to a co-pending, commonly assigned non-provisional patent application entitled "Filler Panel for Equipment Racks and Enclosures," which was filed on Oct. 15, 2010, and assigned Ser. No. 12/905,298. The entire content of the foregoing non-provisional patent application is incorporated herein by reference.

BACKGROUND

1. Technical Field

The present disclosure relates generally to rack- or enclosure-mounted devices and, more particularly, to horizontal managers that are adapted to be detachably mounted with respect to a rack, cabinet or like structure, and to provide advantageous cable management functionalities.

2. Background

Cable management systems (such as cable racks, bays or frames, which are hereinafter referred to as "racks") have long been used in many varied applications, such as in communications and electronic services. Racks are substantially rectilinear metal frames with several vertical railings, each provided with a plurality of mounting and alignment openings or holes that permit mounting of various devices. It is generally desirable to place a filler panel (also known as a blanking panel) to cover empty space in a rack. The use of a filler panel may be for aesthetic reasons, security reasons and/or to guide airflow through the components positioned on or in the rack for cooling purposes. To improve efficiency, it is desirable to provide a filler panel that is easy to install and that may be used in connection with various racks and rack designs.

The Electronic Industries Association ("EIA") has promulgated standards for various dimensions of racks. These standards have allowed manufacturers to produce devices with standardized dimensions that can fit into any EIA compliant rack. Although these standardizations have improved interchangeability of devices between different racks, certain elements of racks have not been standardized. For example, the holes that are formed in the railings of a rack may be round, square and/or threaded. The thickness or depth of the railings in a rack may also vary, e.g., due to the use of different metal thicknesses in the manufacturing process. When manufacturing filler panels for racks, it is generally desirable to provide filler panels that can be used in a variety of racks, e.g., regardless of railing depth/thickness. It is further desirable to provide filler panels that can be removed from one rack and mounted in a different rack, i.e., are interchangeable from one rack to another, both initially and repeatedly after initial deployment.

U.S. Patent Publication No. 2008/0310126 to Lakoduk et al. (Hoffman Enclosures, Inc.) discloses a blanking panel which includes a first pin and a second removable pin. The pins are configured such that the main body of the panel can be alternatively attached to a square-shaped hole with the removable pin intact, or attached to a round-shaped hole with the removable pin removed and the first pin extending through the hole. The blanking panel of Hoffman Enclosures, however, fails to allow a removed pin to be reattached for interchangeable use of the filler panel in a railing with square-shaped holes.

U.S. Pat. No. 7,506,768 to Rassmussen et al. (American Power Conversion Corporation) discloses a blanking panel for use with equipment racks/enclosures that is adapted to be mounted with respect to a pair of vertical mounting rails or flanges of a rack or enclosure without the use of tools or other hardware. When the blanking panel is installed into a rack or enclosure, portions of a body of the blanking panel interface with a surface of an equipment component or another blanking panel installed above or below the blanking panel to thereby form an air seal therebetween.

Despite efforts to date, a need exists for an easy to install horizontal manager capable of engaging a variety of racks interchangeably and of providing advantageous cable management functionalities. These and other disadvantages and/or limitations are addressed and/or overcome by the devices and methods of the present disclosure.

BRIEF DESCRIPTION OF THE DRAWINGS

To assist those of ordinary skill in the art in making the disclosed filler panels, system and methods, reference is made to the appended figures, wherein:

FIG. 2 is a front view of the exemplary filler panel of FIG. 1;

FIG. 3 is a top schematic view of the exemplary filler panel of FIG. 1;

FIG. 4 is a cross-sectional view along the line E-E of FIG. 3;

SUMMARY

Figure 1:
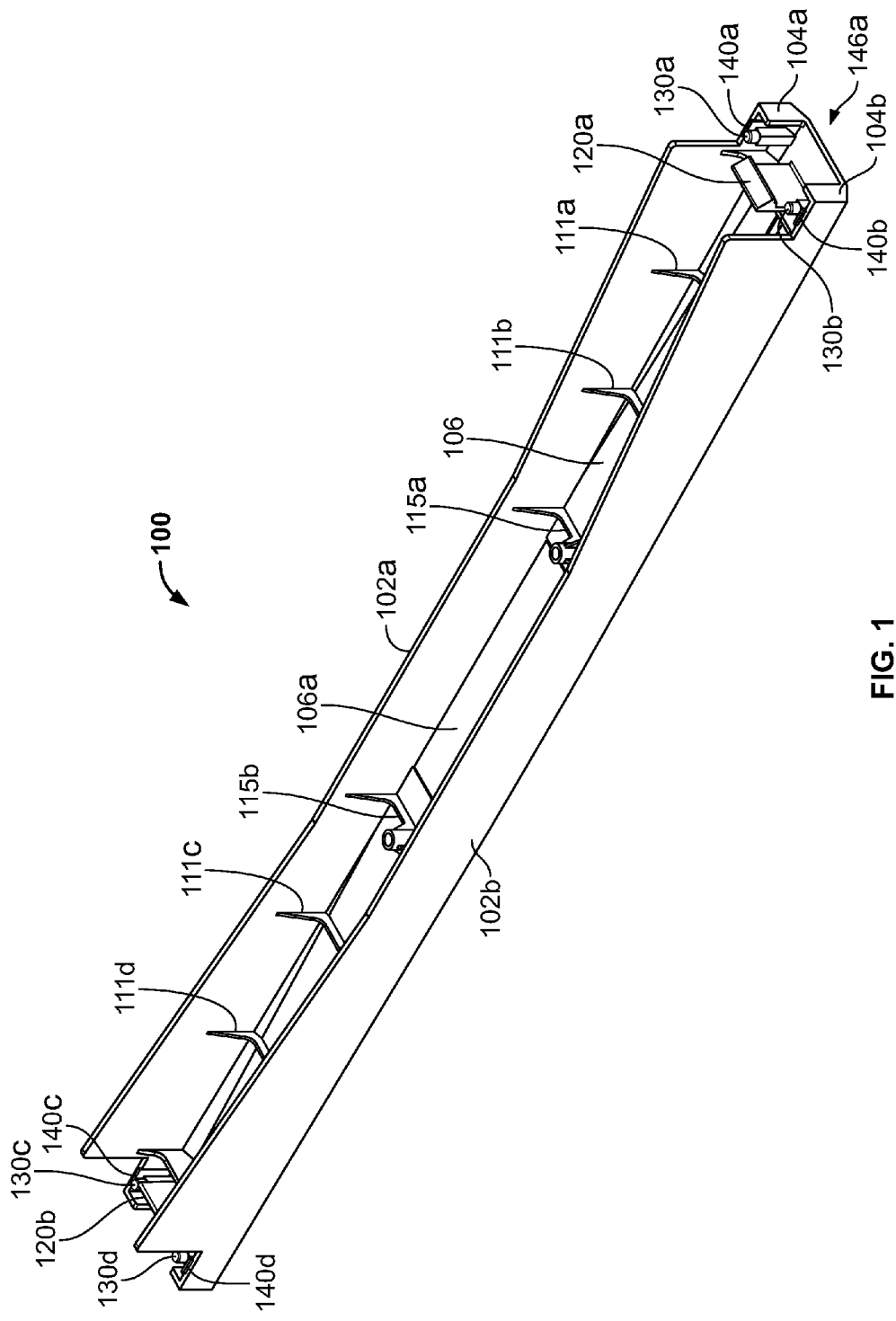
FIG. 1 is a schematic perspective view of an exemplary filler panel according to the present disclosure.

The present disclosure describes filler panels and horizontal managers that can be interchangeably mounted in EIA racks with differing railing thickness and hole shapes. In an exemplary embodiment, the filler panel/horizontal manager includes a pair of latching members disposed on opposing sides of the filler panel/horizontal manager that have an angled stepped surface configured to engage a plurality of railings. A pair of guide posts and locator walls are disposed adjacent each latching member and are configured to guide the filler panel/horizontal manager on to a rack.

Thus, according to exemplary embodiments of the present disclosure, a filler panel or horizontal manager is provided characterized by a panel body that includes, inter alia, (i) two or more latching members, each defining a hood portion, wherein each hood portion includes an angled, stepped latching surface; (ii) two or more guide towers; and (iii) two or more locator walls. The angled, stepped latching surfaces of the hood portion are generally disposed relative to the panel body so as to securely and detachably engage a plurality of racks that are characterized by differing depth dimensions. The two or more guide towers are typically configured to enter holes associated with a railing and to guide the latching member to engage the railing. Of note, the two or more locator walls and the two or more guide towers may be configured to enter holes of varying geometries.

According to exemplary embodiments, the angled, stepped latching surfaces associated with the hood portions of the latching members may define a plurality of stepped surfaces, e.g., two stepped surfaces. The hood portion may define an angle of between about 45 degrees and 60 degrees relative to the x-axis defined by the panel body. The distance between each of the respective latching members and the respective guide posts is generally sufficient to allow the latching member to securely engage the railing of a rack. The panel body may further define finger hold(s) and/or stiffening rib(s). In addition, the panel body may further define a removable insert region that is adapted to receive a component, e.g., a camera, temperature monitor, patch panel, etc.

The present disclosure further provides advantageous methods for detachably engaging a filler panel/horizontal manager with respect to a railing of a rack. In one such method, the steps include (a) providing a filler panel/horizontal manager that includes (i) two or more latching members, each defining a hood portion, wherein each hood portion includes an angled, stepped latching surface; (ii) two or more guide towers; and (iii) two or more locator walls; (b) aligning the guide towers of the filler panel/horizontal manager with holes defined in the railing; and (c) applying a force sufficient to detachably engage the latching member of the filler panel/horizontal manager with respect to the railing. In applying the noted force, the angled stepped surface associated with at least one hood portion advantageously engages the railing of the rack. The filler panel/horizontal manager may be removed from the rack by, e.g., applying a force to a finger hold associated with the filler panel/horizontal manager sufficient to remove the filler panel/horizontal manager from the rack.

In a still further embodiment of the present disclosure, a latching member for a filler panel/horizontal manager is provided that includes an angled stepped surface having at least a first stepped surface and a second stepped surface separated from the first stepped surface by a slot; wherein each of the first and second stepped surfaces is adapted to detachably engage a railing associated with a rack of different thickness dimension. A third latch member may be provided that is separated from the second latch member by a second slot, the third latch member defining a third angled, stepped surface that is substantially the same as the first angled, stepped surface defined by the first latch member.

In further exemplary embodiments, a filler panel/horizontal manager is provided that includes one or more outwardly extending cable management elements, e.g., cable management fingers that define a region for cable capture. Thus, in exemplary implementations, the front face of the disclosed filler panel/horizontal manager may include a plurality of horizontally spaced cable management elements/fingers that are adapted to receive and guide wires/cables with respect to the associated rack/enclosure. The cable management elements/fingers generally define an opening that allows introduction of cables/wires to a cable capture region. The size of the opening may be adjusted/enlarged to permit wire/cable introduction and/or withdrawal, e.g., based on deflection of the cable management element/fingers. The disclosed cable management elements/fingers may be integrally formed with respect to the disclosed filler panel/horizontal manager or fixed/attached with respect thereto, e.g., by sonic welding, adhesive, or mechanical attachment structures, such as a pin/slot arrangement. By positioning a plurality of cable management elements/fingers along the disclosed filler panel/horizontal manager, it is possible to route wires/cables along the front face of a rack/enclosure in a controlled and flexible manner.

Additional features, functions and structural aspects of the disclosed filler panels and associated systems and methods will be apparent from the detailed description which follows, particularly when read in conjunction with the accompanying figures.

DETAILED DESCRIPTION OF EXEMPLARY EMBODIMENT(S)

The present disclosure provides advantageous filler panels/horizontal managers that are configured to be mounted interchangeably and detachably into a variety of racks. The filler panels/horizontal managers of the present disclosure may be advantageously sized to function in cooperation with conventional EIA rack structures, e.g., 19" and 23" racks. Although the present disclosure describes various filler panel implementations, it is to be understood that any and all of the disclosed filler panels may function as a horizontal manager by associating such filler panels with cable management elements/fingers, as disclosed herein.

With reference to FIGS. 1-3, a first exemplary filler panel 100 of the present disclosure is depicted. Filler panel 100 includes first sidewall 102a, second sidewall 102b, front wall 106 and end walls 104a-104d. Defined on opposing ends of the filler panel 100 are latching regions 150a and 150b configured to securely and detachably engage the railings of a rack. Latching region 150a includes latching member 120a, first guide post 130a, second guide post 130b, first locator wall 140a, second locator wall 140b, first end wall 104a, and second end wall 104b. End walls 104a and 104b further define a finger hold 146a on a portion of front wall 106. Disposed on front wall 106 are a plurality of supporting ribs 111a-111d. Further disposed on front wall 106 are first boss 115a and second boss 115b. Latching region 150b mirrors latching region 150a and includes latching member 120b, guide posts 130c and 130d, and locator walls 140c and 140d. Similarly, end walls 104c and 104d define a second finger hold 146b on front wall 106. Further defined on front wall 106 is portion 106a. In some embodiments, portion 106a may be removed to accommodate an optional device, such as a temperature monitoring device, a camera, a patch panel or the like.

Figure 5:
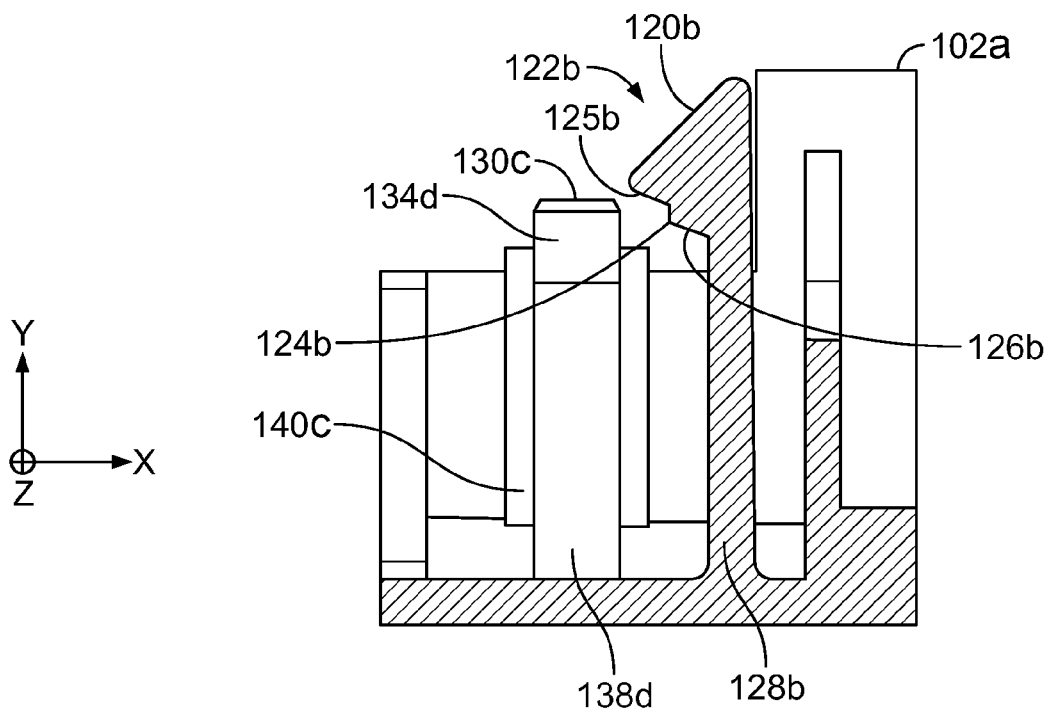
FIG. 5 is an enlarged view of the box A of FIG. 4.

Turning to FIGS. 4 and 5, a detailed view of exemplary latching portion 150b is depicted. FIG. 4 is a cross-sectional view of filler panel 100 taken along the line B-B of FIG. 3. FIG. 5 is an enlarged view of latching portion 150b focused on the region enclosed in square A of FIG. 4. Latching member 120b includes a hood portion 122b and stem portion 128b. Hood portion 122b has a substantially triangular cross section. Hood portion 122b includes angled, stepped surface 124b. Angled stepped surface 124b includes first stepped surface 125b and second stepped surface 126b. Stepped surfaces 125b and 126b may be angled to rise from the x-axis. In use, one of a pair of angled stepped surfaces 125a and 125b (or 126a and 126b), engages the railings of a rack with sufficient force to detachably, yet securely retain the filler panel 100 in position relative to the rack. Those skilled in the art will recognize that the rise between stepped surfaces 125b and 126b may be varied to facilitate engagement of the latching member 120b with respect to railings of different thicknesses.

Those of skill in the art will further recognize that, by varying the angle that hood portion 122b makes with the x-axis, the force with which the latching member 120b engages the railings of a rack (and conversely, the force required to detach latching member 120b from the railings of a rack) may be varied. In some embodiments, the angle defined between the hood portion 122b and the x-axis may be approximately 45 degrees. In other embodiments, the angle defined between the hood portion 122b and the x-axis may be approximately 60 degrees. In some embodiments, angled stepped surfaces 124a and 124b may be configured to include more than two stepped surfaces.

Figure 7:
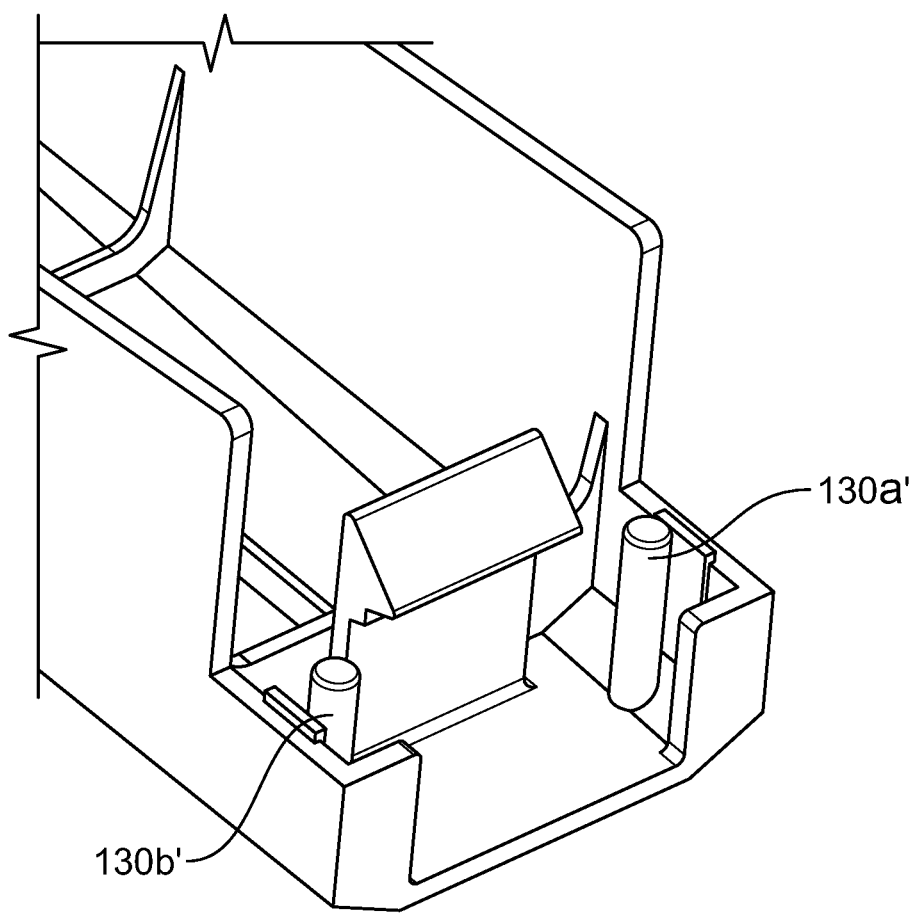
FIG. 7 is an enlarged view of the latching portion of another exemplary filler panel according to the present disclosure.

Referring again to FIGS. 1-5, guide posts 130a-130d include a substantially rectangular box base portion 138a-138d and a substantially cylindrical top portion 134a-134d. Guide posts 130a-130d may be substantially identical in shape and size. The diameter of cylindrical top portions 134a-134d is smaller than the diameter of the screw holes in the railings of EIA approved racks. The cylindrical portions 134a-134d are configured to enter holes in railings to guide the filler panel 100 onto the railings as the latching members 120a and 120b engage the railings. The distance between latching members 120a-120b and guide posts 130a-130d is chosen to ensure latching members 120a and 120b securely engage the surface of a railing. In an alternate embodiment depicted in FIG. 7, guide posts 130a'-130b' are substantially cylindrical. Guide posts 130a-130d may be constructed of a metal or plastic by any manner known in the art including molding and stamping.

Still referring to FIGS. 1-5, locator walls 140a-140d have a substantially rectangular cross-section. Locator walls 140a-140d may be substantially identical to each other in size and shape. Locator walls 140a-140d are positioned to abut sidewalls 102a and 102b. Locator walls 140a-140d are configured to enter square-shaped holes in a railing along with guide posts 130a-130d to guide the filler panel 100 on to the railing as latching members 120a and 120b engage the railing. When filler panel 100 is placed in a rack with round-shaped holes, the locator walls 140a-140d act as an offset from the railing. The height of the locator walls 140a-140d extend above walls 102a and 102b is chosen to ensure that locator walls 140a-140d do not interfere with the retention of the railing by latching members 120a and 120b. In order to enter the square holes of a railing, the length of locator walls 140a-140d along the x-axis is chosen to be less than the length of the sides of square-shaped holes found in EAI racks. Locator walls 140a-140d may be constructed of a metal or plastic by any manner known in the art including molding and stamping.

Figure 6:
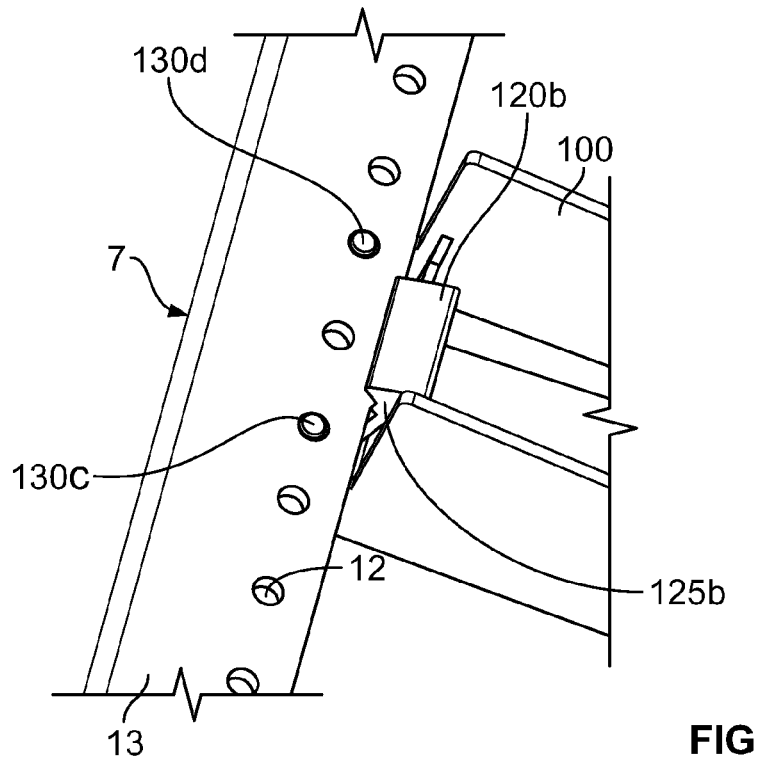
FIG. 6 is an enlarged view of the exemplary filler panel of FIG. 1 mounted in a rack.

Turning to FIG. 6, an enlarged view of filler panel 100 engaging railing 13 of rack 7 is depicted. Rack 7 includes railings having substantially round-shaped holes 12. With further reference to FIGS. 1 and 5, the installation of filler panel 100 onto rack 7 is described. In operation, an installing technician holds filler panel 100 at finger holds 146a and 146b to position guide posts 130a-130d into the round-shaped holes 12. Once positioned, the technician pushes filler panel 100 into the rack 7. The force applied by the technician is sufficient to cause latching members 120a and 120b to flex towards the center of the filler panel 100 until stepped surface 125b engages the railing 13. Finger holds 146a and 146b are similarly used to remove the filler panel 100 from rack 7. Pulling the filler panel 100, disengages the latching members 120a and 120b to remove the filler panel 100 from rack 7. The latching members 120a and 120b of filler panel 100 are configured to be easily removable from a rack. Latching members 120a and 120b may be constructed of any material that allows the latching members 120a and 120b to flex and engage a railing. Latching members 120a and 120b, guide posts 130a-130d and locator walls 140a-140d may be attached to front wall 106 by any means know in the art.

Turning to FIGS. 8-11, an alternative exemplary filler panel 200 according to the present disclosure is schematically depicted. The structure of filler panel 200 is substantially similar to filler panel 100, except that filler panel 200 has more than one latching member located in each latching region 250a and 250b. Latching regions 250a and 250b are mirror images of each other. As shown in more detail in FIG. 9, latching region 250a includes a first latching member 260a, a second latching member 260b, and an intermediate latching member 260c. First latching member 260a is separated from intermediate latching member 260c by slot 223a, and intermediate latching member 260c is separated from second latching member 260b by slot 223b. The noted slots 223a, 223b allow each of latching members 260a, 260b, 260c to operate substantially independently.

According to exemplary embodiments of the present disclosure, first latching member 260a and second latching member 260b define a first angled step for latching purposes, whereas intermediate latching member 260c defines a distinct angled step, such that first and second latching members 260a, 260b are adapted to engage a railing of a first depth dimension and intermediate latching member 260c is adapted to engage a railing of a second depth dimension. According to this exemplary implementation, the latching forces of first and second latching members 260a, 260b is additive and substantially balanced so as to avoid potential torquing relative to the rack. In exemplary implementations of filler panel 200, the latching surface of intermediate latching member 260c may be approximately equal (or at least of comparable dimension) to the cumulative latching surface of first and second latching members 260a, 260b. Advantageously, the use of more than one latching member allows the filler panel 200 to engage a larger number of variable thickness railings.

Figure 9:
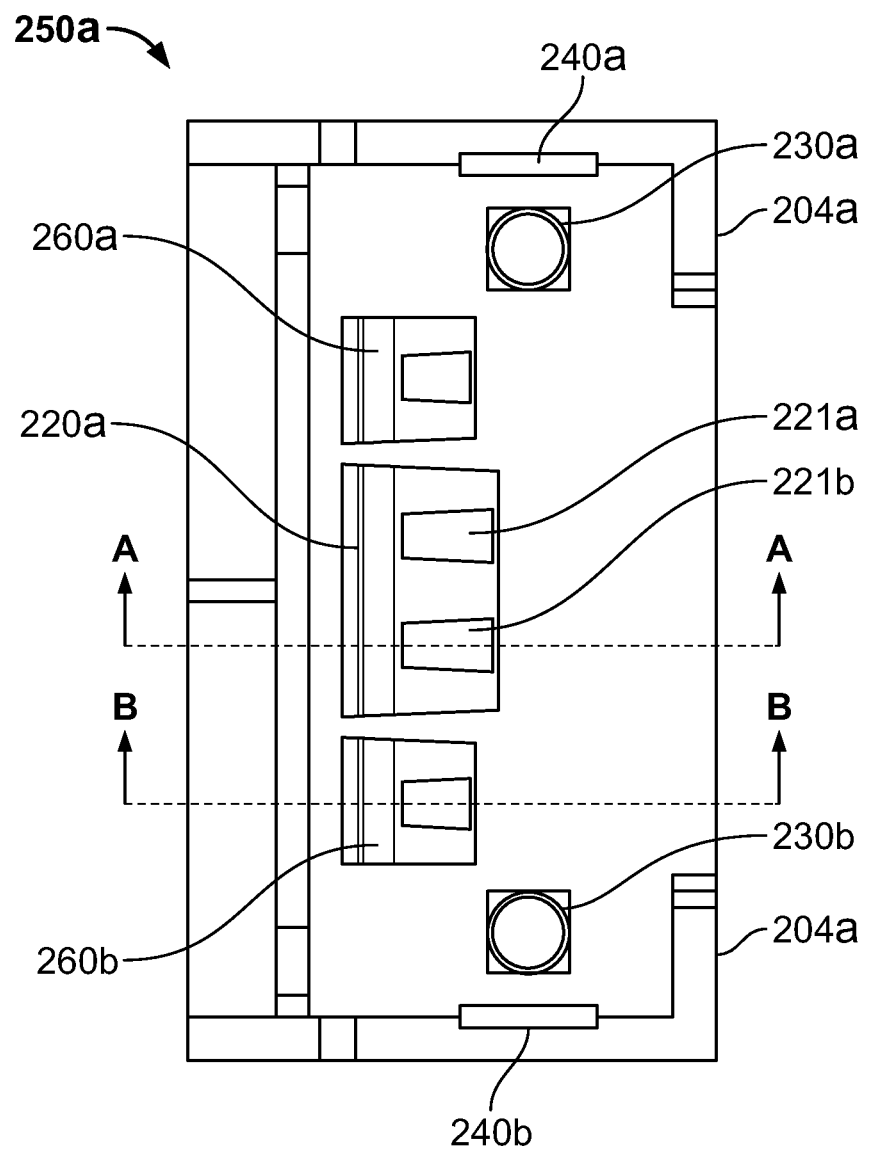
FIG. 9 is an enlarged top schematic view of a latching portion of FIG. 8.
Figure 10:
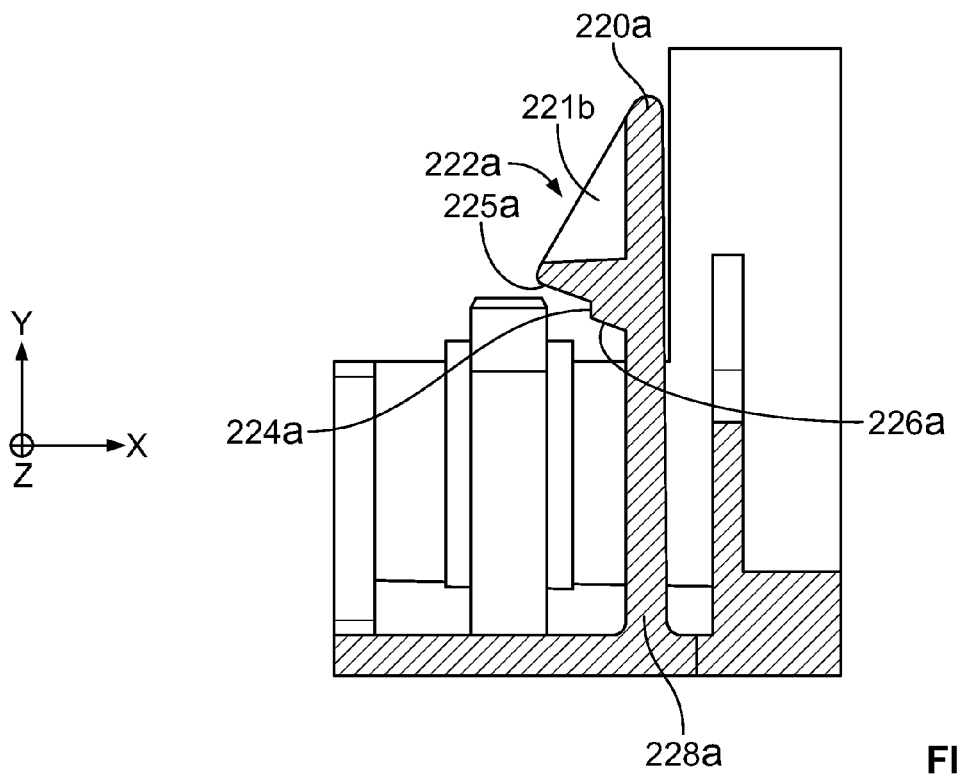
FIG. 10 is a cross-sectional view along the line A-A of FIG. 9.

With reference to FIG. 10, a cross-sectional view taken along line A-A of FIG. 9 is depicted. Latching member 260c includes hood portion 222a and stem portion 228a. Hood portion 222a has a substantially triangular cross-section and includes angled stepped surface 224a. Angled stepped surface 224a includes a first stepped surface 225a and a second stepped surface 226a configured to engage a railing. With further reference to FIG. 9, hood portion 222a may include core cavities 221a and 221b. Those skilled in the art will recognize that core cavities of varying size may be included into any of the exemplary embodiments of a latching member disclosed herein without impacting the functionality of the latching member.

Figure 11:
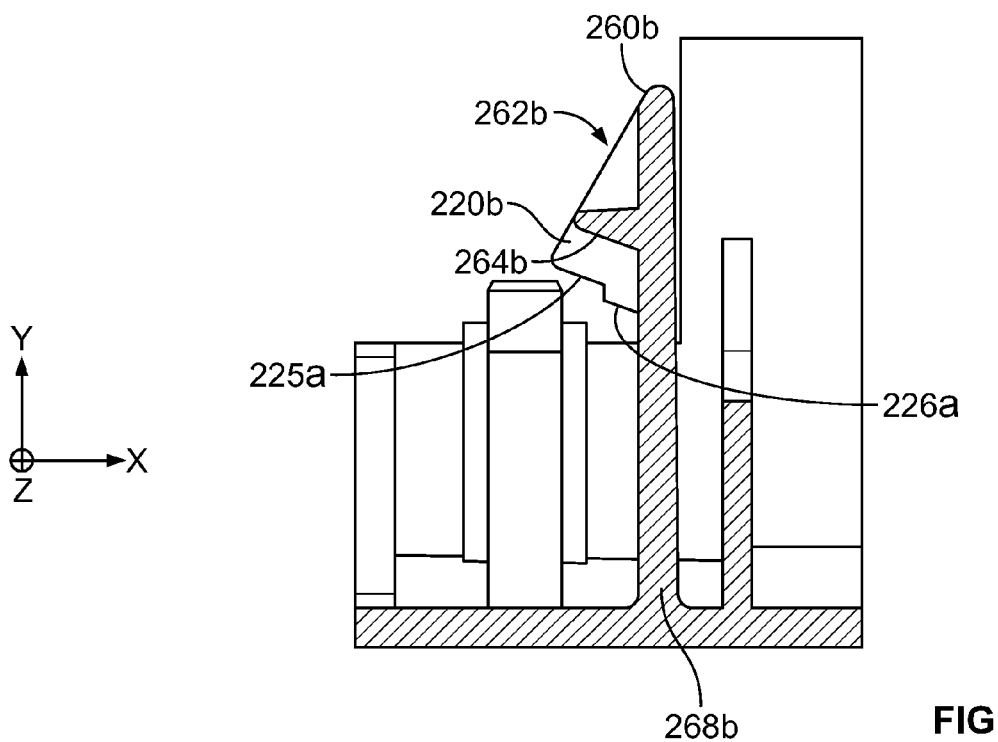
FIG. 11 is a cross-sectional view along the line B-B of FIG. 9.

Turning now to FIG. 11, a cross-sectional view taken along line B-B of FIG. 9 is illustrated. Second latching portion 260b includes a hood portion 262b and a stem portion 268b. Hood potion 262b includes angled surface 264b. Angled surface 264b is configured to engage a railing of a rack. Angled surface 264b lies in a different plane on the y-axis from the planes of stepped surfaces 225a and 226a of latching member 260c. Surface 264b may be angled to rise from the x-axis. Advantageously, the disclosed latching members associated with filler panel 200 allow filler panel 200 to interchangeably and detachably engage railings of different thicknesses, because any of the stepped surface of the latching members 260c-260c' or 260a, 260b, 260a', 260b' (not pictured) may engage the railing depending on the railing thickness thereof.

Figure 8:
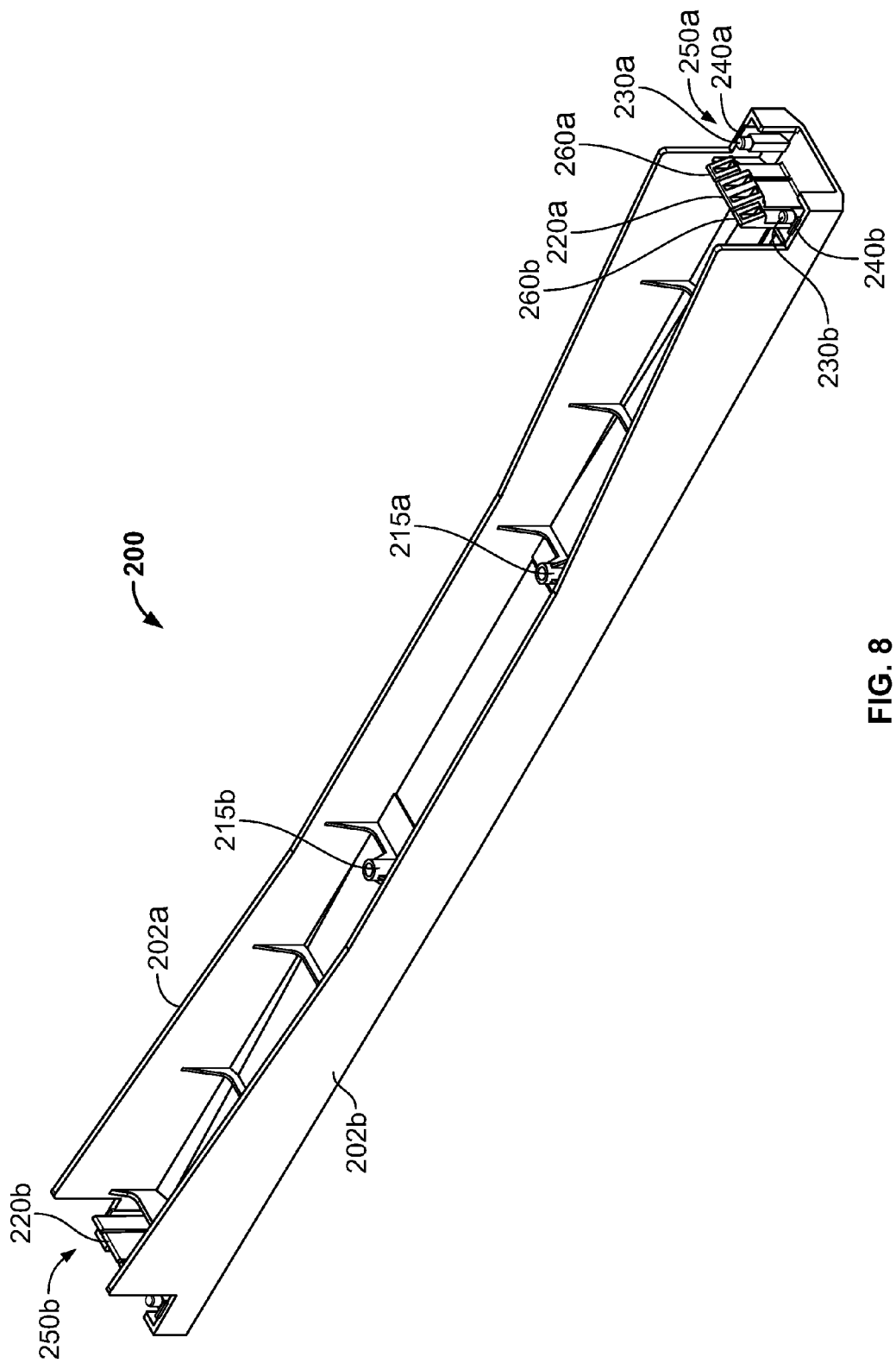
FIG. 8 is a schematic perspective view of another exemplary filler panel according to the present disclosure.
Figure 12:
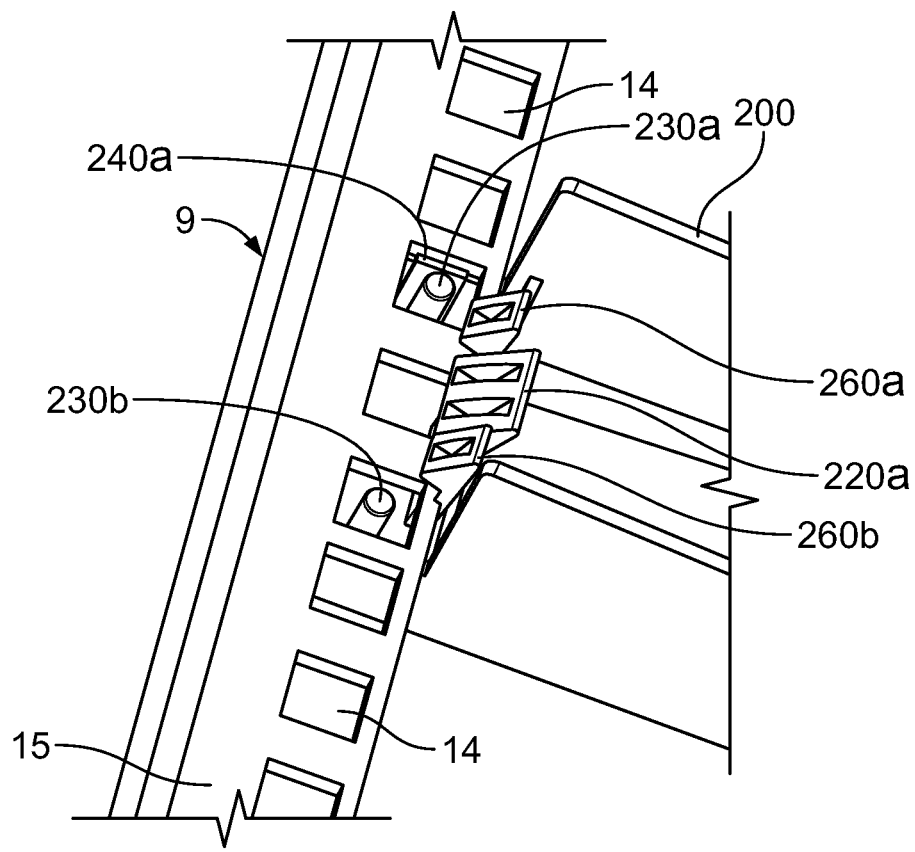
FIG. 12 is an enlarged view of the exemplary filler panel of FIG. 9 mounted in a rack.

Turning to FIG. 12, an enlarged view of filler panel 200 engaging railing 15 of a rack 9 is depicted. Railing 15 includes substantially square-shaped holes 14. With further reference to FIGS. 8, 10 and 11, the installation of filler panel 200 onto rack 9 is described. In operation, an installing technician holds filler panel 200 at finger holds 246a and 246b to position guide posts 230a-230d and locator walls 240a-240d into the square-shaped holes 14. Once positioned, the technician pushes filler panel 200 into the rack 9. The force applied by the technician is sufficient to cause hood portions 222a-222b of latching members 260c and 260c' and hood portions 262a-262d of first and second latching members 260a, 260a', 260b, 260b' to flex towards the center of filler panel 200 until the cooperative angled surfaces of the appropriate latching members engage the railing 15. To remove filler panel 200 from rack 9, a technician holds filler panel 200 at finger holds 246a and 246b and pulls the filler panel 200 to disengage the latching members from the rack 9. The disclosed latching members may be constructed of any material that allows sufficient flexibility to engage a railing. The latching members, guide posts and locator walls may be integrally formed or separately fabricated and then attached to front wall 206 by any means know in the art.

Figure 13:
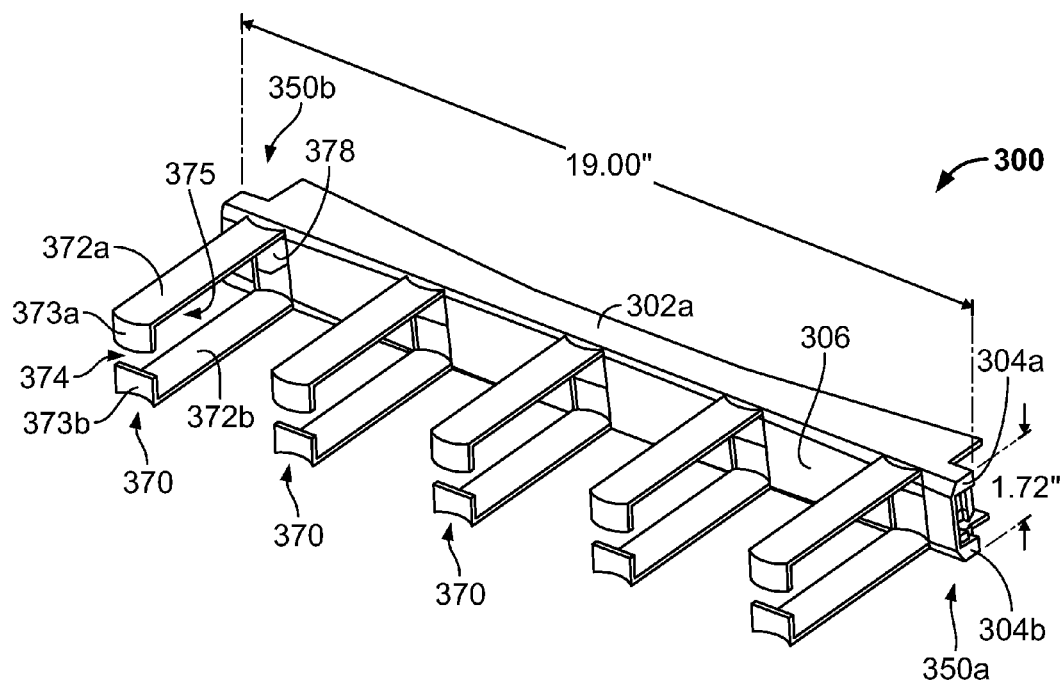
FIG. 13 is a schematic perspective view of an exemplary horizontal manager according to the present disclosure.

With reference to FIG. 13, an exemplary horizontal manager 300 is schematically depicted according to the present disclosure. Horizontal manager 300 is similar in structural design to filler panel 100 described herein with reference to FIGS. 1-3. Thus, horizontal manager 300 includes first/second sidewalls (sidewall 302a is shown), front wall 306 and first/second end walls 304a/304b. Latching regions 350a and 350b are defined on opposite ends of horizontal manager 300. The latching regions are configured to securely and detachably engage the railings of a rack in the manner described hereinabove with filler panels 100 and 200. Accordingly, additional description with respect to the advantageous latching functionality of horizontal manager 300 is not provided herein, but is instead incorporated by reference from the prior discussions relative to filler panels 100 and 200.

With further reference to FIG. 13, horizontal manager 300 includes a plurality of horizontally spaced cable management elements 370. In the exemplary embodiment of FIG. 13, five (5) cable management elements 370 are provided as part of horizontal manager 300, although the present disclosure is not limited by or to an implementation with five cable management elements. Rather, the number and spacing of cable management elements is generally selected to provide a desired level of wire/cable management, as will be apparent to persons skilled in the art.

Each exemplary cable management element 370 extends outwardly relative to front wall 306 of horizontal manager 300 and includes first and second fingers 372a, 372b that cooperate to define an opening 374 between opposed faces 373a, 373b. Fingers 372a, 372b are generally deflectable so as to permit the size of opening 374 to be increased, thereby accommodating introduction and withdrawal of one or more wires/cables (not pictured) into the interior cable capture region 375 defined therebetween. In the exemplary implementation of FIG. 13, fingers 372a, 372b define a substantially rectangular cable capture region 375, but alternative cable capture region geometries may be provided, e.g., through variation of the design/geometry of fingers 372a, 372b. The cable capture regions of the horizontally spaced cable management elements 370 are generally aligned in the horizontal plane, thereby facilitating the routing of wires/cables from side-to-side relative to the horizontal manager 300 and, accordingly, the rack/enclosure to which horizontal manager 300 is mounted.

Cable management element 370 is generally secured or mounted with respect to front wall 306 of horizontal manager 300. Thus, for example, cable management element 370 may include a finger support flange region 378 that structurally cooperates with and supports outwardly extending fingers 372a, 372b, and that is secured or mounted with respect to the front wall 306 of horizontal manager 300. Flange region 378 may be fixedly or detachably secured/mounted with respect to front wall 306 in various ways. For example, the flange region 378 may be integrally formed with front wall 306, e.g., in the molding process, or may be secured with respect to the front wall 306, e.g., by way of welding (e.g., sonic welding), adhesive and/or mechanical mounting means. Of note, detachable mounting mechanisms for cable management element 370 relative to front wall 306 provide the advantage that cable management elements may be introduced or removed from horizontal manager 300 on an as-needed basis.

Figure 14:
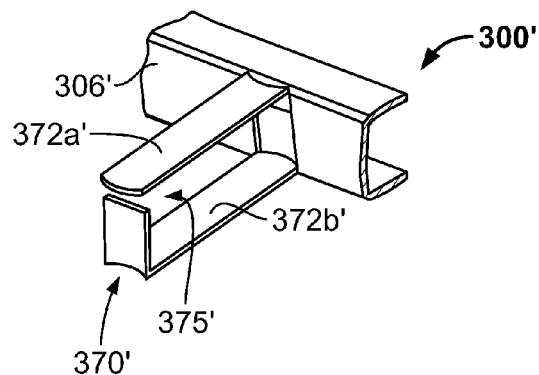
FIG. 14 is a schematic perspective view of a portion of an alternative exemplary horizontal manager according to the present disclosure.

Turning to FIG. 14, an alternative cable management element 370' is schematically depicted in association with front wall 306' of horizontal manager 300'. Cable management element 370' differs from cable management element 370 in that opening 374' is defined in a corner region defined by cooperating fingers 372a', 372b'. Thus, unlike cable management element 370 wherein the fingers 372a, 372b are mirror images of each other, fingers 372a', 372b' differ in geometry relative to each other, with finger 372a' defining a flat extension arm and finger 372b' defining an L-shaped arm. Notwithstanding the difference in finger design, the overall function and operation of cable management element 370' is essentially the same as cable management element 370.

Horizontal managers 300, 300' leverage the functional benefits of the latching functionalities described with reference to filler panels 100, 200 to facilitate advantageous wire/cable management functionality along the front face of a rack/enclosure.

As will be readily apparent to persons skilled in the art, exemplary filler panels 100 and 200 and horizontal managers 300, 300' described herein advantageously allow for interchangeable and detachable mounting of filler panels/horizontal managers with respect to racks. In exemplary embodiments, the filler panels/horizontal managers include guideposts configured to enter both round-shaped holes and squared shaped holes in a railing. In further exemplary embodiments, the filler panels/horizontal managers include locator walls configured to enter squared-shaped holes along with the guide posts. When used with racks having round-shaped holes, the locator walls act as offsets from railings. In addition, the disclosed filler panels/horizontal managers may advantageously include one or more pairs of identical latching members disposed at opposing sides of the filler panel/horizontal manager to securely engage the surface of a railing. Each pair of latching members may include one or more stepped surfaces configured to engage a railing. Advantageously, the filler panels/horizontal managers of the present disclosure may be mounted in a rack having round, square or threaded holes without removing any portion of the filler panel/horizontal manager. Furthermore, once installed, a filler panel/horizontal manager may be removed from one rack and placed in a rack with different hole shapes and railing thicknesses.

Although the present disclosure has been described with reference to exemplary embodiments and implementations, it is to be understood that the present disclosure is neither limited by nor restricted to such exemplary embodiments and/or implementations. Rather, the present disclosure is susceptible to various modifications, enhancements and variations without departing from the spirit or scope of the present disclosure. Indeed, the present disclosure expressly encompasses such modifications, enhancements and variations as will be readily apparent to persons skilled in the art from the disclosure herein contained.

The invention claimed is:

1. A horizontal manager, comprising:
   a panel body that includes: (i) two or more latching members, each defining a hood portion, wherein each hood portion includes an angled, stepped latching surface, (ii) two or more guide posts, (iii) a permanent and non-removable locator wall positioned proximal to and spaced from each guide post by an open slot, each permanent and non-removable locator wall fixedly attached to the panel body, and (iv) one or more outwardly extending cable management elements;
   wherein each guide post has a top portion that extends further from the panel body than its proximal locator wall extends from the panel body;
   wherein the angled, stepped latching surface associated with each hood portion defines a plurality of stepped surfaces;
   wherein the top portion of each guide post is configured to enter and fill a round hole associated with a first railing and guide at least one of the latching members to engage the first railing while its proximal locator wall cannot enter the same respective round hole;
   wherein a second railing defines a plurality of square holes; and
   wherein after each guide post has entered a round hole associated with the first railing and thereafter removed from each respective round hole, then each permanent and non-removable locator wall and its proximal guide post are both configured to enter the same respective square hole defined in the second railing and to guide at least one of the latching members to engage the second railing.

2. The horizontal manager of claim 1, wherein the plurality of stepped surfaces of each hood portion includes at least a first stepped surface and a second stepped surface;
   wherein the first stepped surface of each hood portion is capable of securely and detachably engaging the first railing;
   wherein the second stepped surface of each hood portion is capable of securely and detachably engaging the second railing; and
   wherein the mounting rail thickness of the first railing is different than the mounting rail thickness of the second railing.

3. The horizontal manager of claim 1, wherein the top portion of each guide post is cylindrical; and wherein each guide post includes a rectangular base portion, with its cylindrical top portion extending from the rectangular base portion.

4. The horizontal manager of claim 1, wherein each hood portion defines an angle of between about 45 degrees and 60 degrees relative to the x-axis defined by the panel body.

5. The horizontal manager of claim 1, wherein the angled stepped latching surfaces associated with each hood portion rises about 20 degrees from the x-axis defined by the panel body.

6. The horizontal manager of claim 1, wherein the panel body further defines at least one finger hold; and wherein the panel body further defines one or more stiffening ribs.

7. The horizontal manager of claim 1, wherein each guide post includes a cylindrical top portion that is configured to enter a round hole associated with the first railing and guide at least one of the latching members to engage the first railing having the round holes; and
   wherein each permanent and non-removable locator wall and the rectangular base portion of the guide post proximal to each permanent and non-removable locator wall is configured to enter the same respective square hole defined in the second railing and guide at least one of the latching members to engage the second railing having the square holes.

8. The horizontal manager of claim 1, wherein the panel body further defines a removable insert region.

9. The horizontal manager of claim 1, wherein the one or more outwardly extending cable management elements includes a plurality of horizontally spaced cable management elements.

10. The horizontal manager of claim 1, wherein the one or more outwardly extending cable management elements includes at least one cable management element that includes (i) a first outwardly extending finger, (ii) a second outwardly extending finger, and (iii) an opening defined between the first finger and the second finger that is configured and dimensioned to accommodate introduction and withdrawal of a wire or cable.

11. The horizontal manager of claim 10, wherein at least one of the first and second fingers is deflectable so as to vary the size of the opening.

12. The horizontal manager of claim 10, wherein the first and second fingers define a cable capture region therebetween.

13. The horizontal manager of claim 10, wherein the first and second fingers are L-shaped elements.

14. The horizontal manager of claim 10, wherein only one of the first and second fingers is an L-shaped element.

15. A method for detachably engaging a horizontal manager, comprising the steps of:
   providing a first rack, the first rack defining a plurality of holes that are round;
   providing a panel body that includes: (i) two or more latching members, each defining a hood portion, wherein each hood portion includes an angled, stepped latching surface that defines a plurality of stepped surfaces, (ii) two or more guide posts, (iii) a permanent and non-removable locator wall positioned proximal to and spaced from each guide post by an open slot, each permanent and non-removable locator wall fixedly attached to the panel body, and each guide post having a top portion that extends further from the panel body than its proximal locator wall extends from the panel body, and (iv) one or more outwardly extending cable management elements;
   aligning the top portion of each guide post with a respective round hole defined in a first rack so that the top portion of each guide post enters and fills a round hole of the first rack while its proximal locator wall cannot enter the same respective round hole;
   applying a force sufficient to detachably engage the latching members of the panel body with respect to the first rack;
   detaching the latching members from the first rack;
   providing a second rack, the second rack defining a plurality of holes that are square;
   aligning each permanent and non-removable locator wall and its proximal guide post with a respective square hole defined in the second rack so that each locator wall and its proximal guide post enter the same respective square hole; and
   applying a force sufficient to detachably engage the latching members of the panel body with respect to the second rack.

16. The method of claim 15, further comprising the steps of: (i) detaching the latching members from the second rack, (ii) providing a third rack, (iii) aligning the top portion of each guide post with a respective round hole defined in a third rack so that the top portion of each guide post enters and fills a round hole of the third rack while its proximal locator wall cannot enter the same respective round hole, (iv) applying a force sufficient to detachably engage the latching members with respect to the third rack, (v) detaching the latching members from the third rack, (vi) providing a fourth rack, (vii) aligning each permanent and non-removable locator wall and its proximal guide post with a respective square hole defined in the fourth rack so that each locator wall and its proximal guide post enter the same respective square hole, and (viii) applying a force sufficient to detachably engage the latching members of the panel body with respect to the fourth rack.

17. The method of claim 15, wherein the top portion of each guide post is cylindrical;

wherein each guide post includes a rectangular base portion, with its cylindrical top portion extending from the rectangular base portion; and wherein each permanent and non-removable locator wall and the rectangular base portion of the guide post proximal to each locator wall enter the same respective square hole of the second rack when the locator walls and guide posts are aligned with holes of the second rack.

18. The method of claim 17, wherein the cylindrical top portion of each guide post enters and fills a round hole of the first rack when the guide posts are aligned with holes of the first rack.

19. The method of claim 15, further comprising removing the panel body from the first rack by applying a force to a finger hold associated with the panel body sufficient to remove the panel body from the first rack.

20. The method of claim 15, further comprising introducing one or more wires or cables to a cable capture region defined by at least one of the one or more outwardly extending cable management elements.

* * * * *